(12) United States Patent
Huang et al.

(10) Patent No.: US 8,598,659 B2
(45) Date of Patent: Dec. 3, 2013

(54) SINGLE FINGER GATE TRANSISTOR

(75) Inventors: Chin Dixie Huang, Corvallis, OR (US);
Jeffrey A. Hintzman, Corvallis, OR (US); Dennis James Schloeman, Corvallis, OR (US); Hang Liao, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1357 days.

(21) Appl. No.: 11/259,335

(22) Filed: Oct. 26, 2005

(65) Prior Publication Data

US 2007/0090454 A1 Apr. 26, 2007

(51) Int. Cl.
*H01L 29/66* (2006.01)

(52) U.S. Cl.
USPC .......... 257/343; 257/335; 257/339; 257/409; 257/E29.166

(58) Field of Classification Search
USPC .................. 257/335, 339, 343, 409, E29.166
See application file for complete search history.

(56) References Cited

U.S. PATENT DOCUMENTS

| | | | |
|---|---|---|---|
| 4,767,722 A | 8/1988 | Blanchard | |
| 5,432,370 A | 7/1995 | Kitamura et al. | |
| 5,485,027 A * | 1/1996 | Williams et al. | 257/343 |
| 5,534,721 A * | 7/1996 | Shibib | 257/339 |
| 5,686,754 A * | 11/1997 | Choi et al. | 257/488 |
| 5,973,367 A * | 10/1999 | Williams | 257/365 |
| 6,060,362 A | 5/2000 | Rhee | |
| 6,100,121 A | 8/2000 | Yang | |
| 6,429,110 B1 | 8/2002 | Tseng | |
| 6,765,242 B1 | 7/2004 | Chang et al. | |
| 6,812,522 B2 | 11/2004 | Ishihara | |
| 2002/0031897 A1 * | 3/2002 | Ueda et al. | 438/424 |
| 2003/0071320 A1 | 4/2003 | Kocon | |
| 2004/0224492 A1 | 11/2004 | Yang et al. | |
| 2005/0073007 A1 * | 4/2005 | Chen et al. | 257/355 |

FOREIGN PATENT DOCUMENTS

| | | |
|---|---|---|
| EP | 0504992 | 9/1992 |
| JP | 4328873 | 11/1992 |

OTHER PUBLICATIONS

Terashima, T. et al; "A new level-shifting technique by divided RESURF structure"; IEEE Internat'l Sumposium proceedings; May 26, 1997.
International Search Report for PCT/US2006/029447—dated Jun. 15, 2007; mailed Jul. 2, 2007.

* cited by examiner

*Primary Examiner* — Allison P Bernstein

(57) ABSTRACT

A transistor device includes a lightly doped layer of semiconductor material of a first type and a body region of semiconductor material of a second type. A source region of the first type is formed in the body region, the source region being more doped than the lightly doped layer. A drain region of the first type is formed in the lightly doped layer, the drain region being more doped than the lightly doped layer. A drift region of the lightly doped layer is further provided disposed between the body region and the drain region. Additionally, a gate electrode is provided surrounding the drain region. The gate electrode is partially disposed over a thin oxide and partially over a thick oxide, wherein the gate electrode extended over the thick oxide from the thin oxide controls the electric field in the drift region to increase the avalanche breakdown of the drain region.

24 Claims, 3 Drawing Sheets

SINGLE FINGER GATE TRANSISTOR

Laterally Diffused Metal Oxide Semiconductors (LDMOS) transistors are used in a variety of electrical circuit applications. A typical LDMOS transistor architecture uses multiple-finger gates, as those skilled in the art will recognize. However, for circuit applications with high voltage and low drive current, the known LDMOS architecture includes at least a two finger gates. Thus, the transistor is much larger than necessary where silicon and die space is unnecessarily wasted.

Current LDMOS architecture comprises at least two gates and two drains with one shared source completely enclosed by a polysilicon gate. The structural symmetry of the design increases the effective channel width per unit area, and has the advantage of reducing the device on-resistance. This architecture favors power circuit applications where both high drive current and high voltage are required. However, the dual gate design limits the minimum device size and does not allow a designer to use small width/length (W/L) ratios where it would be appropriate for application requiring high voltage but low drive current. Moreover, current LDMOS architecture results in adding supplementary elements to meet performance requirements. As a result, the supplementary elements consume more die space and add more variability to circuit performance. For typical non-LDMOS transistors, both gate width and gate length are variables for a circuit designer. However, due to the nature of LDMOS architecture, the gate length is typically fixed by the process. Thus, only gate width is a variable for a circuit design.

Therefore, a need exists for high voltage devices with a smaller width. Accordingly, a new device is needed that has a smaller die size. It is desired that cell size is reduced without breakdown voltage degradation. Additionally, a need exists for a high voltage device that removes the need for at least some of the supplementary elements that present devices require. It is also preferable to improve yield in production.

SUMMARY

A transistor device is provided, including a lightly doped layer of semiconductor material of a first type and a body region of semiconductor material of a second type. A source region of the first type is formed in the body region. The source region being more doped than the lightly doped layer. A drain region of the first type is formed in the lightly doped layer, the drain region being more doped than the lightly doped layer. A drift region of the lightly doped layer is further provided disposed between the body region and the drain region. Additionally, a gate electrode is provided surrounding the drain region. The gate electrode is partially disposed over a thin oxide and partially over a thick oxide, wherein the gate electrode extended over the thick oxide from the thin oxide controls the electric field in the drift region to increase the avalanche breakdown of the drain region.

BRIEF DESCRIPTION OF THE DRAWINGS

The features and inventive aspects of the embodiments will become more apparent upon reading the following detailed description, claims, and drawings, of which the following is a brief description:

DETAILED DESCRIPTION

Figure 1:
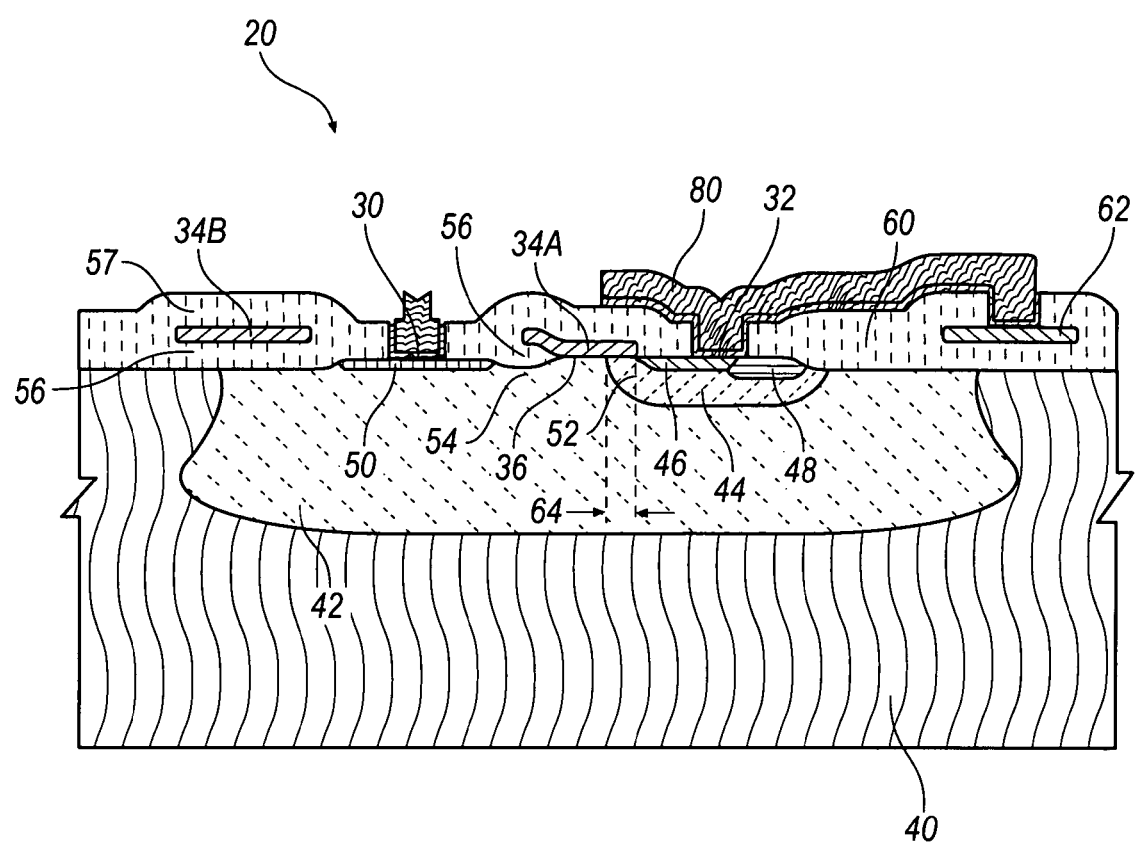
FIG. 1 is a partial cross-sectional view of an exemplary single finger gate LDMOS transistor, according to an embodiment.

Referring now to the drawings, illustrative embodiments are shown in detail. Although the drawings represent the embodiments, the drawings are not necessarily to scale and certain features may be exaggerated to better illustrate and explain an innovative aspect of an embodiment. Further, the embodiments described herein are not intended to be exhaustive or otherwise limit or restrict the precise form and configuration shown in the drawings and disclosed in the following detailed description.

Figure 2:
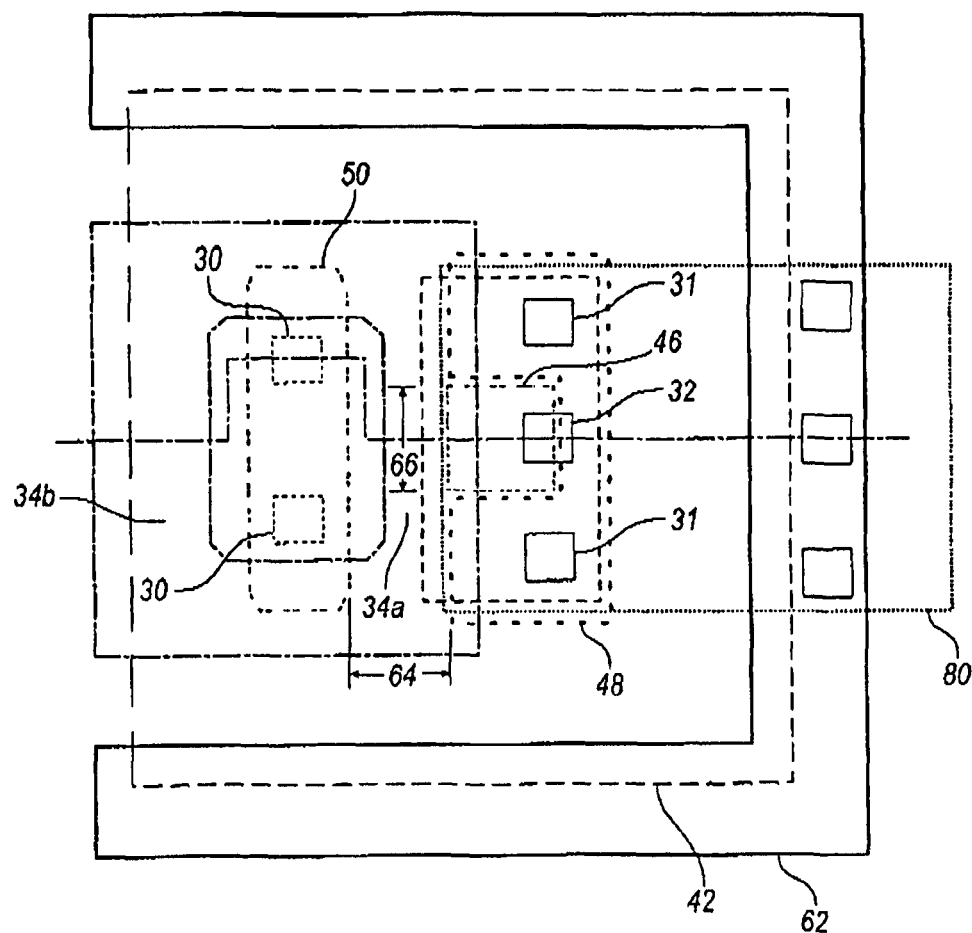
FIG. 2 is a partial overlay view illustrating the drain region, surrounding ring, gate electrode, source region and body region of the embodiment of FIG. 1.
Figure 3:
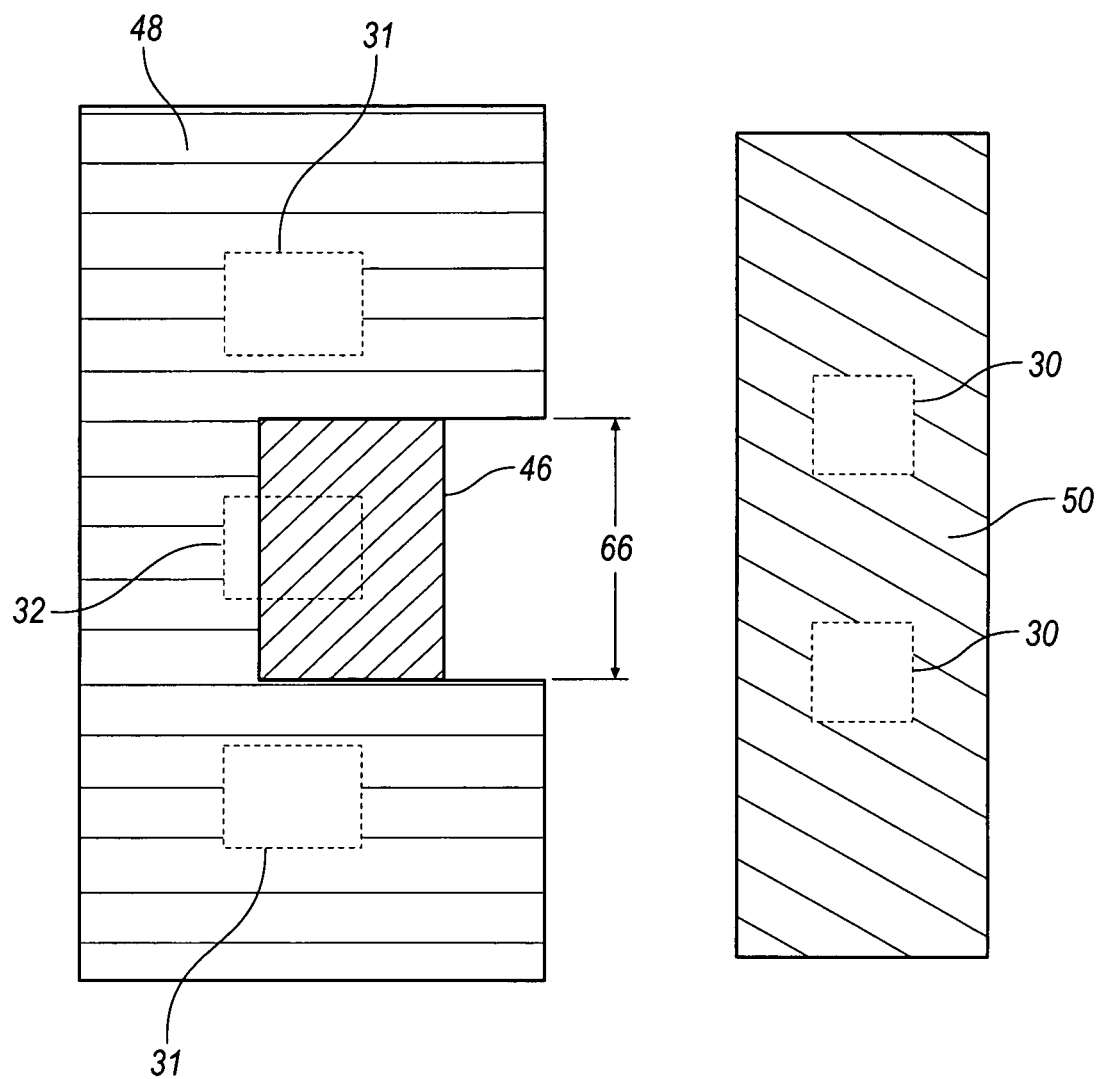
FIG. 3 is a partial overlay view illustrating the horse-shoe shaped region immediately surrounding the source region, the source split contact, and the drain region of the embodiment of FIG. 1.

Referring to FIGS. 1-3, an embodiment of a transistor 20 is shown. Transistor 20 is configured as a single finger gate LDMOS transistor. Transistor 20 includes a drain contact 30, a source split contact 32, a polysilicon gate electrode 34A and a polysilicon surrounding ring 34B. Further, a lightly doped well 42 of a first type (N) is configured within a semiconductor substrate 40 of a second type (P). A body region 44 of a second type (P) is configured within lightly doped well 42. A source region 46 (N+) and a horse-shoe shaped region 48 (P+) are built within body region 44. For clarity, FIG. 2 includes a gap between source region 46 and horse-shoe shaped region 48. However, in practice source region 46 and horse-shoe shaped region 48 are directly contacting one another. A drain region 50 is disposed below drain contact 30 and is configured as a more heavily doped (N+) first type. Source split contact 32 shorts source region 46 and horse-shoe shaped region 48.

Polysilicon gate electrode 34A is partially disposed over a thin gate oxide 36 and a thick field oxide layer 56 that insulates gate electrode 34A from underlying structures. The portion of gate electrode 34A that is disposed partially over field oxide layer 56 modifies the electrical field at the surface of the edge of gate electrode 34A, hence, providing a higher voltage capability. Further, gate electrode 34A is disposed over a conducting channel 52 that is a portion of body region 44. Conducting channel 52 is formed under gate oxide 36 and at the surface of body region 44. An effective gate length 64, e.g., channel length, of transistor 20 is measured by the overlap of gate electrode 34A above body region 44 and source region 46 (N+) diffusion. Both body region 44 (P) and source region 46 (N+) are self aligned to gate electrode 34A and surrounding ring 34B because these two process steps are after the gate definition (the process is discussed in detail below).

In order to reduce device size, and i.e., cell size, without degrading high voltage handling capabilities, a high voltage technique is applied to transistor 20 consisting of a lightly doped drain drift region 54 and a field plate under gate electrode 34A. Gate electrode 34A is extended over gate oxide 36 forming a polysilicon field plate to enhance the breakdown voltage capability of transistor 20.

High voltage drain region 50 is fully surrounded by polysilicon gate electrode 34A and polysilicon surrounding ring 34B which function as a polysilicon guide ring (See FIGS. 1 and 2). Because the potential of surrounding ring 34B is biased at the same potential as high-voltage LDMOS transistor gate electrode 34A, which is normally much lower than the field threshold, an effective isolation between high voltage drain region 50 and low-voltage circuit regions (not shown) can be achieved. Thus, no additional polysilicon guide ring is needed around transistor 20 for suppression of interference when the source of transistor is tied to ground in a low side application.

As illustrated in FIG. 1, a portion of surrounding ring 34B is over well 42 and portion of surrounding ring 34B is over substrate 40. An oxide layer 60 is built over transistor 20 as an insulator and may be comprised of a plurality of oxide layers. Surrounding ring 34B is built over first field oxide layer 56 that serves to isolate high voltage drain region 50 from well 42, substrate 40, and any surrounding low voltage circuitry (not shown). Polysilicon gate electrode 34A and surrounding ring 34B is further isolated from other circuits or interconnections (not shown) configured above transistor 20 by a second oxide layer 57.

In high side applications, a guide ring 62, e.g., a leakage suppression ring, may be implemented around source region 46 and that partially surrounds well 42. See FIGS. 1-2. Guide ring 62 suppresses the breakdown voltage degradation due to leakage current from substrate 40 to source region 46. Guide ring 62 may be built over oxide layer 56 which may be formed using first field oxide layer 56 or several oxide layers, as discussed in detail below.

Guide ring 62 may use either polysilicon or metal interconnect layers. When using polysilicon interconnect layers, guide ring 62 is built over first oxide layer 56. When a metal interconnect is used, guide ring 62 is built over a first field oxide layer 56 and a second oxide layer or a first, second, and third oxide layer (not shown in the Figures). Guide ring 62 is built partially over well 42 and partially over substrate 40. The total width and area of guide ring 62 over well 42 and substrate 40 is important to the effectiveness of isolation. Guide ring 62 is tied to body region 44 and source region 46 through a metal interconnect 80 (see FIG. 2). As discussed above, on low side applications polysilicon gate electrode 34A and surrounding ring 34B completely surround drain region 50. Thus, there is no need for an additional guide ring.

Transistor 20 also includes a horse-shoe shaped region 48 of a more heavily doped second type (P+) that partially surrounds source region 46. (See FIGS. 2 and 3). Horse-shoe shaped region 48 suppresses the parasitic NPN transistor inside LDMOS transistor 20. Thus, the risk of latch-up is reduced. Horse-shoe shaped region 48 (P+) is also used to effectively terminate the transistor channel in the width direction, defining an effective gate width 66. Body region 44 and source region 46 are shorted internally through source split contact 32 that is partially formed over horse-shoe shaped region 48 (P+) and partially over source region 46 (N+). Body region 44 and source region 46 are also internally connected by metal interconnect 80 through a body contact 31 which built on the top of horse-shoe shaped region 48 (P+) and source split contact 32.

Gate length 64 and gate width 66 of transistor 20 are illustrated in FIGS. 1 and 2. For transistor 20, gate width 66 is the distance of source region 46 enclosed by horse-shoe shaped region 48 (P+). See FIG. 3. A typical dual gate LDMOS transistor includes a gate width that is twice the distance of the source width. For example, a two finger gate 10V LDMOS transistor integrated in a 1 µm CMOS technology, the minimum gate width is 23.2 µm due to design rule constraints. With the same design rules in place (1 µm CMOS technology), a gate width of 3.2 µm (40V LDMOS) can be achieved applying the embodiment described in FIGS. 1-3 for transistor 20. Such a reduction in gate width provides for a 40% reduction in cell size and 86% reduction of drive current for the minimum LDMOS transistor. As is well understood by those skilled in the art, particular dimensions are less important than relative sizes because of rapid progression with miniaturization. The reduction in size of 40% may be scaled to compatible process technologies. Additionally, design rules for alternative processes may allow for even further reduction in cell size. Thus, the particular dimension of 3.2 µm is not considered a design criterion and is not to be used to determine any minimum size that may be applied with the embodiment in FIGS. 1-3. It is fully expected that advances in manufacturing processes will allow the embodiments to have gate lengths of less than 3.2 µm.

Now turning to the manufacture of transistor 20, the process steps for making the exemplary body of LDMOS transistor 20 is described.

First, well 42 (N) is formed within substrate 40 (P) through N-type doping implant and a thermal drive process. Then, the transistor active area is defined within well 42 (N). Thick field oxide layer 56 is grown around the active area. Then thin gate oxide 36 is over the active area prior to the polysilicon deposition.

The polysilicon layer is then deposited and patterned to form gate electrode 34A and surrounding ring 34B, and optionally, guide ring 62. Body region 44 is formed using photo, implant and thermal drive. Body region 44 has a depth which is much deeper than source region 46 (see FIG. 1). Due to the blockage of implant by polysilicon gate electrode 34A, body region 44 is self-aligned to the poly gate. Optionally, there may be a lightly doped drain (LDD) extension implant/drive and spacer formation before building the N+ source and drain region. A horse-shoe shaped region 48 (P+) is formed after the definition of source region 46 (N+) and drain region 50 (N+).

Second oxide layer 57 (or first dielectric thin film) is deposited. Contact holes (body contact 31, source split contact 32 and drain contact 30) are etched in second oxide layer 57. A silicide layer is created in the contact areas to reduce the contact resistance. A first interconnect metal layer is applied to fill the contact holes and allow for the interconnection of the various devices formed on substrate 40. The leakage suppression ring 62 may be created along with the first interconnect metal layer, if appropriate. More dielectric layers, vias and interconnect metal layers may be formed, depending on the needs of the integrated circuit (IC). Because these methods are known in the art, they are not described here in detail.

While the present invention has been particularly shown and described with reference to the foregoing preferred embodiment, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and system within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiment is illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A transistor device comprising:
    a lightly doped layer of semiconductor material of a first conductive type;
    a body region of semiconductor material of a second conductive type formed in said lightly doped layer;
    said first conductive type being different than said second conductive type;
    a source region of said first conductive type formed in said body region, said source region being more doped than said lightly doped layer;
    a horse-shoe shaped region of said second conductive type formed in said body region, said horse-shoe shaped region partially surrounding said source region and being more doped than said body region;
    a drain region of said first conductive type formed in said lightly doped layer, said drain region being more doped than said lightly doped layer;
    a drift region of said lightly doped layer contiguously disposed between said body region and said drain region; and
    a gate electrode surrounding said drain region, said gate electrode partially disposed over a thin oxide and partially over a thick oxide, wherein said gate electrode extended over said thick oxide from over said thin oxide controls the electric field in said drift region to increase the avalanche breakdown of said drain region.

2. The device of claim 1, wherein said gate electrode is polysilicon.

3. The device of claim 1, further comprising a leakage suppression ring partially surrounding said source region and said drain region, said leakage suppression ring being electrically connected to said source region.

4. The device of claim 3, wherein said leakage suppression ring is polysilicon.

5. The device of claim 4, wherein said leakage suppression ring is disposed over said thick oxide.

6. The device of claim 5, wherein said leakage suppression ring is further disposed over a partial lightly doped layer of said first conductive type and a partial lightly doped substrate of said second conductive type.

7. The device of claim 3, wherein said leakage suppression ring is metallic.

8. The device of claim 7, wherein said leakage suppression ring is formed of a metal interconnect layer.

9. The device of claim 8, wherein said metal interconnect layer is disposed over a plurality of insulative oxide layers, said metal interconnect layer further disposed over said partial lightly doped layer of said first conductive type and a partial lightly doped substrate of said second conductive type.

10. The device of claim 1, further comprising an insulative oxide between said gate electrode and said drift region, said insulative oxide further positioned between said gate electrode and said drain region.

11. The device of claim 1, wherein said horse-shoe shaped region electrically contacts said source region and said body region.

12. A laterally diffused metal oxide semiconductor device comprising:
    a lightly doped layer of semiconductor material of a first conductive type;
    a body region of semiconductor material of a second conductive type formed in said lightly doped layer;
    said first conductive type being different than said second conductive type;
    a source region of said first conductive type formed in said body region, said source region being more doped than said lightly doped layer;
    a drain region of said first conductive type formed in said lightly doped layer, said drain region being more doped than said lightly doped layer;
    a drift region of said lightly doped layer contiguously disposed between said body region and said drain region;
    a gate electrode partially disposed over said drift region, wherein said gate electrode controls the electric field in said drift region; and
    a horse-shoe shaped region of said second conductive type formed in said body region, said horse-shoe shaped region being more doped than said body region, said horse-shoe shaped region partially surrounding said source region,
    wherein said horse-shoe shaped region electrically contacts said source region and said body region.

13. The device of claim 12, wherein said gate electrode increases the avalanche breakdown of said drain region.

14. The device of claim 12, further comprising:
    a guide ring surrounding said drain region, wherein said gate electrode is a portion of said guide ring.

15. The device of claim 14, wherein said guide ring is polysilicon.

16. The device of claim 14, further comprising an insulative oxide between said guide ring and said drift region, said insulative oxide further positioned between said guide ring and said drain region.

17. The device of claim 12, further comprising a leakage suppression ring partially surrounding said source region and said drain region.

18. The device of claim 17, wherein said leakage suppression ring is polysilicon and is electrically connected to said source region.

19. The device of claim 18, wherein said leakage suppression ring is disposed over a thick oxide.

20. The device of claim 19, wherein said leakage suppression ring is further disposed over said lightly doped layer of said first conductive type and a partial lightly doped substrate of said second conductive type.

21. The device of claim 17, wherein said leakage suppression ring is metallic.

22. The device of claim 21, wherein said leakage suppression ring is formed with a metal interconnect layer.

23. The device of claim 22, wherein said leakage suppression ring is electrically connected to said source region.

24. The device of claim 23, wherein said metal interconnect layer is disposed over a plurality of layers of oxide, said metal interconnect layer further disposed over a partial lightly doped layer of said first conductive type and a partial lightly doped substrate of a second conductive type.

* * * * *